United States Patent [19]
Chen et al.

[11] Patent Number: 5,751,040
[45] Date of Patent: May 12, 1998

[54] SELF-ALIGNED SOURCE/DRAIN MASK ROM MEMORY CELL USING TRENCH ETCHED CHANNEL

[75] Inventors: Ling Chen, Sunnyvale, Calif.; Hung-Cheng Sung, Kaohsinng; Chi-Shiung Lo, Hsinchu, both of Taiwan

[73] Assignee: Taiwan Semiconductor Manufacturing Company Ltd., Hsin-Chu, Taiwan

[21] Appl. No.: 716,809

[22] Filed: Sep. 16, 1996

[51] Int. Cl.$^6$ ................. H01L 27/02; H01L 27/10
[52] U.S. Cl. ............. 257/332; 257/390; 257/394; 257/401
[58] Field of Search ............. 257/390, 331, 257/332, 334, 394, 401

[56] References Cited

U.S. PATENT DOCUMENTS 5,244,824  9/1993  Sivan ........................... 437/52
5,288,666  2/1994  Lee .............................. 437/200
5,300,804  4/1994  Arai ............................. 257/332
5,338,953  8/1994  Wake ........................... 257/331

Primary Examiner—Donald Monin
Attorney, Agent, or Firm—George O. Saile; Stephen B. Ackerman; Graham S. Jones

[57] ABSTRACT

A device and a method are provided for manufacture of that semiconductor memory device on a silicon semiconductor substrate with a vertical channel. A dielectric layer pattern with openings through it is formed. Trenches are formed in the surface of the semiconductor substrate. The trenches have sidewalls. A spacer layer is formed on the surface of the device. The spacer layer is shaped to form spacers in the trenches on the sidewalls. Source/drain regions are formed by ion implanting ions to deposit dopant into the substrate. The device is annealed to form source/drain regions in the substrate. A dielectric layer is formed over the device. A conductive word-line is formed and patterned over the dielectric layer.

20 Claims, 14 Drawing Sheets

SELF-ALIGNED SOURCE/DRAIN MASK ROM MEMORY CELL USING TRENCH ETCHED CHANNEL

BACKGROUND OF THE INVENTION

1. Field of the Invention

This invention relates to semiconductor memory devices and more particularly to vertical ROM devices.

2. Description of Related Art

U.S. Pat. No. 5,244,824 of Sivan for "Trench Capacitor and Transistor Structure and Method for Making the Same" shows a vertical channel memory cell for a DRAM.

Even with a flat type cell, cell size remains large.

SUMMARY OF THE INVENTION

An object of this invention is to reduce the size of the Mask ROM cell to half the size of a flat-cell using the same layout rule.

After deposition of the metal on the surface of the device form a silicide from the doped surfaces of the substrate including the surfaces of the trenches with the exception of the surfaces protected by the spacers. Subsequent to formation of the silicide performing a source/drain self-aligned ion implantation.

Preferably, subsequent to the source/drain self-aligned ion implantation remove the spacer, whereby the substrate including the trenches is exposed, and anneal the device to drive in the deposit of ion implanted dopant into the subtrate to form source regions and drain regions therein.

Preferably, subsequent to removing the spacer layer and annealing, form a gate oxide layer over the device including the trenches.

Subsequent to forming a gate oxide layer over the device including the trenches, form a gate word line layer over the gate oxide layer.

Preferably the source regions extend across beneath the trenches and the drain regions are juxtaposed with the trenches above the ends of the source regions.

Subsequent to forming and patterning the conductive word-line the steps are performed comprising forming a code implant mask over the word-line layer, and ion implanting through the code implant mask into the device.

In accordance with another aspect of this invention, a semiconductor memory device is formed on a silicon semiconductor substrate with a vertical channel comprising trenches in the surface of the silicon semiconductor substrate. The trenches have sidewalls, ion implanted source/drain regions in the substrate self-aligned with the trenches, a dielectric layer over the source/drain regions, and a conductive word-line over the dielectric layer. The source/drain mask ROM memory cell includes a trench etched channel. The source/drain regions comprises regions annealed into the silicon semiconductor substrate. The source regions extend across beneath the trenches and the drain regions are juxtaposed with the trenches above the ends of the source regions. The source/drain regions include a dopant and a metal silicide formed from a metal and silicon in the silicon semiconductor substrate, which metal preferably comprises cobalt.

The source/drain mask ROM memory cell with a trench etched channel includes a juxtaposed pair of vertical transistors formed on opposite sides of the channel. A ROM code program implant has been ion implanted into the device between a the source region and a the drain region in a selected region of the device. An ion implanted code implant mask is formed in the device. Source/drain regions comprise regions annealed into the silicon semiconductor substrate. Source regions extend across beneath the trenches and the drain regions are juxtaposed with the trenches above the ends of the source regions. The source/drain regions include a dopant and a metal silicide formed from a metal and silicon in the silicon semiconductor substrate. The metal comprises cobalt. The source/drain mask ROM memory cell with a trench etched channel with a juxtaposed pair of vertical transistors formed on opposite sides of the channel. A ROM code program implant has been ion implanted into the device between a the source region and a the drain region in a selected region of the device. An ion implanted code implant mask is formed in the device, comprising a flat structure. The flat structure includes no field oxide structures.

In accordance with a further aspect of this invention, a semiconductor memory device is formed on a silicon semiconductor substrate. The device includes a vertical channel. Trenches are formed in the surface of the silicon semiconductor substrate, the trenches having sidewalls, the trenches including bases, and the substrate including upper surfaces between the trenches. A dielectric layer pattern with openings therein, includes source/drain dopant which has been ion implanted into the bases and the upper surfaces of the substrate and annealed to form source/drain regions in the silicon semiconductor substrate. A second dielectric layer over the device, and a conductive word-line over the dielectric layer. The dielectric layer comprises a gate oxide layer over the device including the trenches.

A source regions extends across beneath the trenches and the drain regions are juxtaposed with the trenches above the ends of the source regions. Metal is deposited on the surface of the source and drain regions has been annealed into a metal silicide in the source/drain regions. The source regions extend across beneath the base of the trenches and the drain regions extend across beneath the upper surfaces, the drain regions being juxtaposed with the trenches above the ends of the source regions.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a Mask ROM memory cell technology employing a process for forming the source and the drain of a device at the same time. In the embodiment of FIGS. 2A–2M, the source/drain regions are silicided to reduce source/drain resistance. There is a flat structure ROM, i.e. no field oxide region in the ROM. In addition, there is one trench for two transistors, i.e. the ROM cell size is reduced to half of a conventional flat cell using the same layout rule.

FIGS. 1A–1L show the process flow for formation of a ROM cell in accordance with the method of this invention. Note that FIGS. 1A–1L show a ROM cell without silicide on the source or the drain, as contrasted with FIGS. 2A–2M, where the source/drain regions are silicided to reduce source/drain resistance.

Figure 1A:
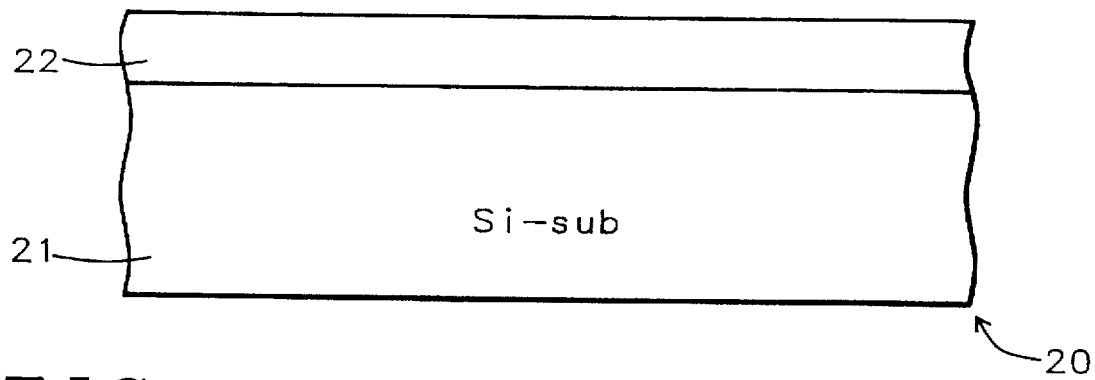
FIGS. 1A–1L show the process flow for formation of a ROM cell in accordance with the method of this invention.

FIG. 1A shows a device 20 in the early stages of manufacture comprising a silicon substrate (Si-sub) 21 on the surface of which an initial dielectric layer in the form of a blanket, masking, silicon dioxide "oxide" layer 22 having a thickness of from about 500 Å to about 3,000 Å, which is formed by the process of (1) dry or wet thermal oxidation and (2) CVD oxide deposition of LTO (Low Temperature Oxide), basically $SiH_4+SiO_2$ or HTO (high temperature oxide, basically $SiH_4$ (or $SiH_2Cl_2$)+$N_2O$.

Figure 1B:
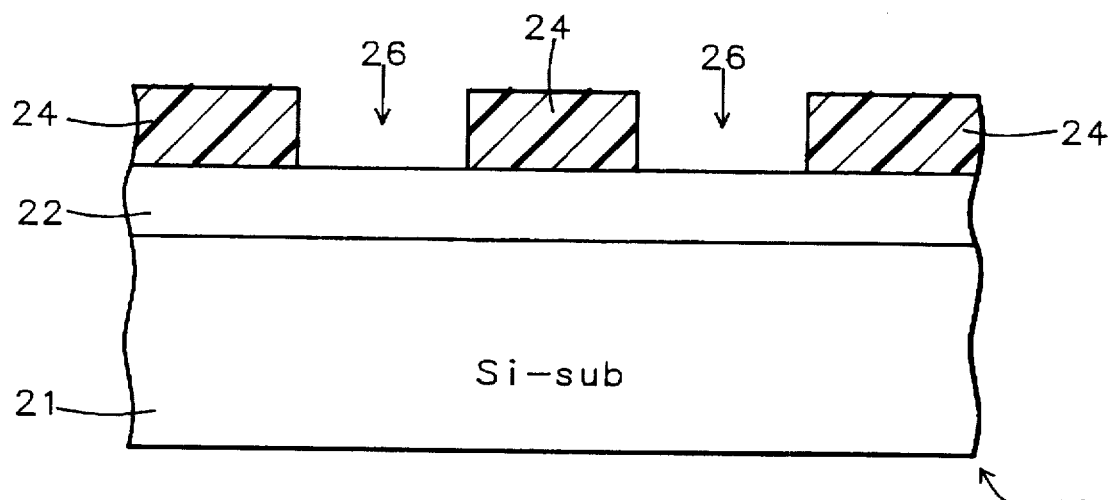

FIG. 1B shows the device of FIG. 1A with a mask 24 with openings 26 therein formed on masking "oxide" layer 26. The mask 24 which is composed of photoresist has been patterned photolithographically with a source/drain pattern by exposure and development in a conventional way. Then the patterned mask 24 is employed to etch away the unwanted portions of layer 22 leaving behind source/drain mask elements of layer 22 below mask 24. The etching of silicon dioxide masking "oxide" layer 22 is performed through openings 26 in mask 24 to form openings 27 in masking oxide layer 22. openings 27 in masking oxide layer 22 are below openings 26 in mask 24. The etching of masking "oxide" layer 22 is performed by plasma etching using gases such as $C_2F_6$, $CHF_3$ or $CF_4$ as well-known etchants for oxide removal.

After etching, the mask elements 24 are stripped from the device 20 by means of a conventional process for removal of photoresist. The preferred stripping process is preferably plasma stripping (gas of $O_2$) followed by $H_2SO_4/H_2O_2$ cleaning.

Figure 1C:
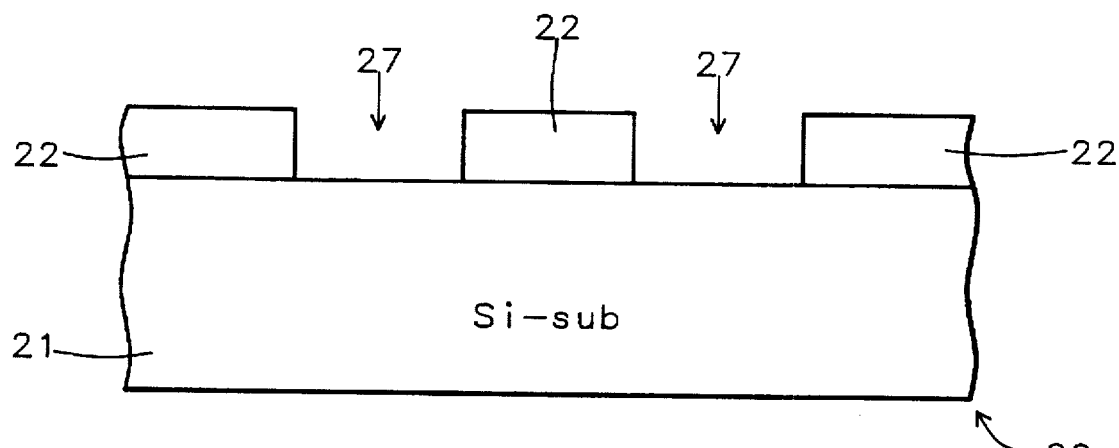

FIG. 1C shows the device of FIG. 1B with the new openings 27 etched in silicon dioxide "oxide" layer 22 and after the stripping of the mask 24.

Figure 1D:
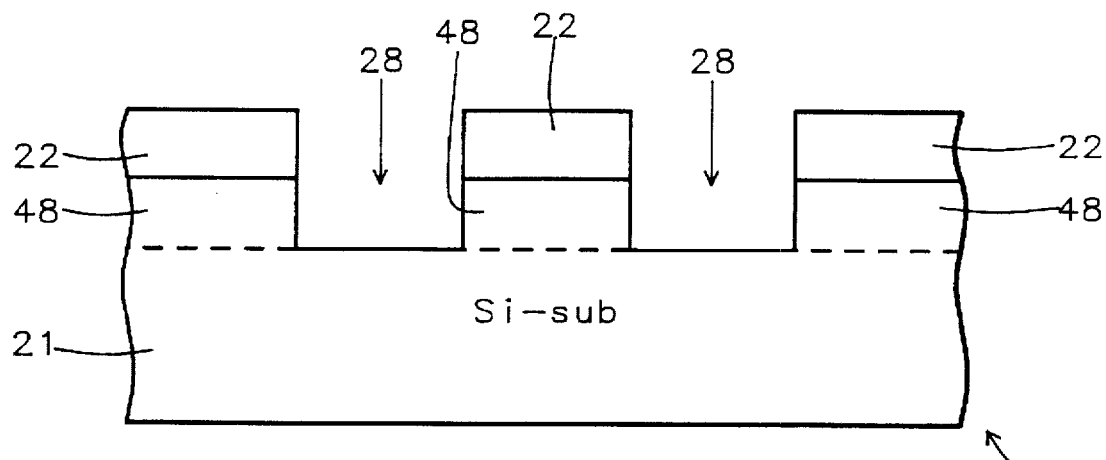

FIG. 1D shows the device of FIG. 1C after "trench" etching of silicon substrate 21 through openings 27 in layer 22 silicon dioxide masking "oxide" layer 22 to form trenches 28 in P-silicon substrate 21 to a depth of from about 3,000 Å to about 15,000 Å. The trenches 28 have vertical sidewalls and a horizontal base parallel to the surface of the substrate 21. The substrate 21 has upper surfaces (the original surfaces of the substrate) between and/or aside from the trenches 28. The etching of P- silicon substrate 21 is performed by plasma etching using a gas such as $Cl_2$, HBr, or other conventional etchants. After the plasma etching to form trenches 28, wet chemical cleaning is performed using an aqueous solution of acids and alcohol such as $HF/HNO_3/CH_3COOH$ to remove possible contamination or damage introduced by the plasma etching process. Adjacent to the trenches 28 are regions 48 of the substrate 21 which will provide the vertical channels of ROM cells.

Figure 1E:
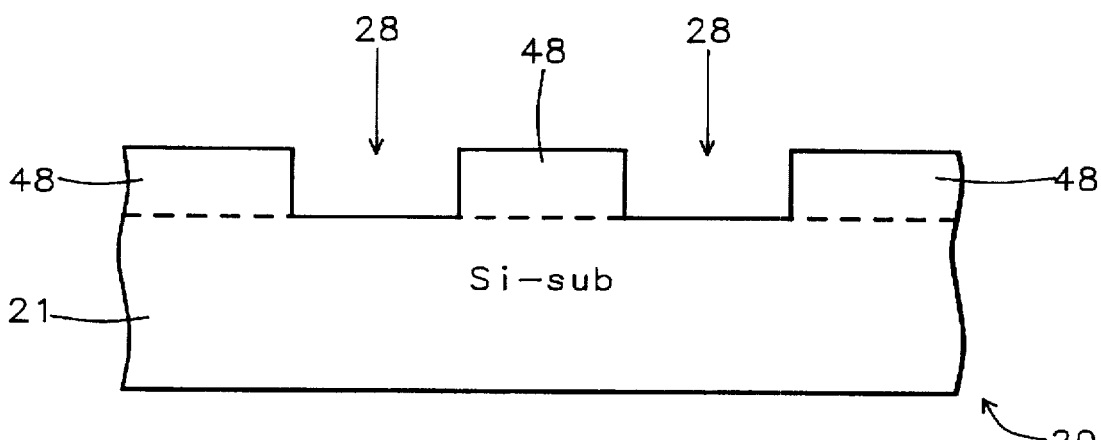

FIG. 1E shows the device of FIG. 1D after removal (stripping) of the remainder of the masking, silicon dioxide "oxide" layer 22, leaving the trenches 28 between the regions 48. This second etching of masking "oxide" layer 22 is performed using wet chemical etching such as HF or BOE (buffered oxide etchant.) In FIG. 1B and FIG. 1C on the other hand, plasma oxide etching was used because a vertical etched profile is needed there and is not necessary in connection with FIG. 1E.

Figure 1F:
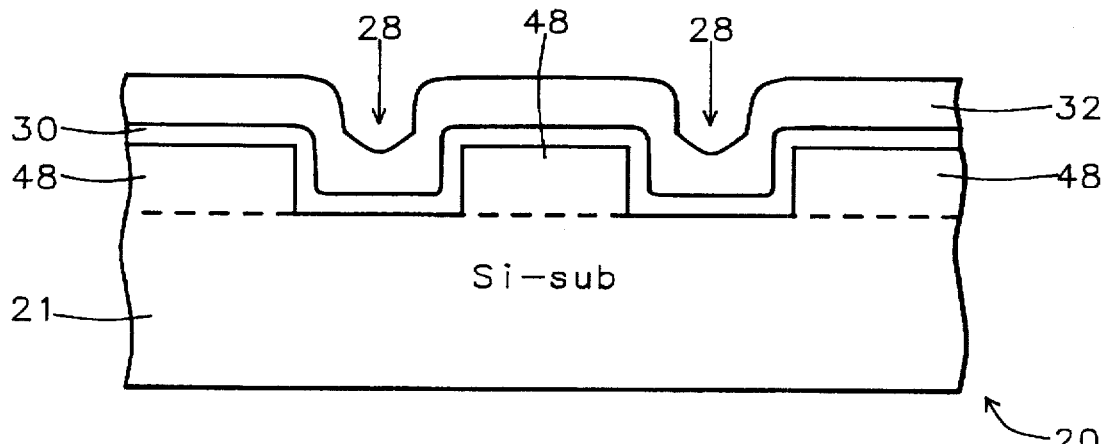

FIG. 1F shows the device of FIG. 1E after formation of a sub-spacer dielectric layer 30 (which underlies the spacer layer to follow.) The sub-spacer layer comprises a silicon layer to follow.) The sub-spacer layer comprises a silicon dioxide "oxide" layer 30 having a thickness of from about 200 Å to about 1,000 Å, formed by the thermal oxidation.

Next, as shown in FIG. 1F a blanket spacer layer 32, preferably, composed of polysilicon or silicon nitride ($Si_3N_4$) is deposited having a thickness of from about 1,500 Å to about 4,000 Å. In the case of polysilicon it is formed by the process of LPCVD (low pressure CVD) with a $SiH_4$ gas. In the case of silicon nitride ($Si_3N_4$), LPCVD with $SiH_2Cl_2$ and $NH_3$ gases is used. The advantage of using polysilicon or silicon nitride ($Si_3N_4$) is easier for end-point-detection (on oxide) so that plasma spacer etching will not damage the silicon. Alternatively, oxide (i.e. silicon dioxide) can be used instead of polysilicon or silicon nitride ($Si_3N_4$).

Figure 1G:
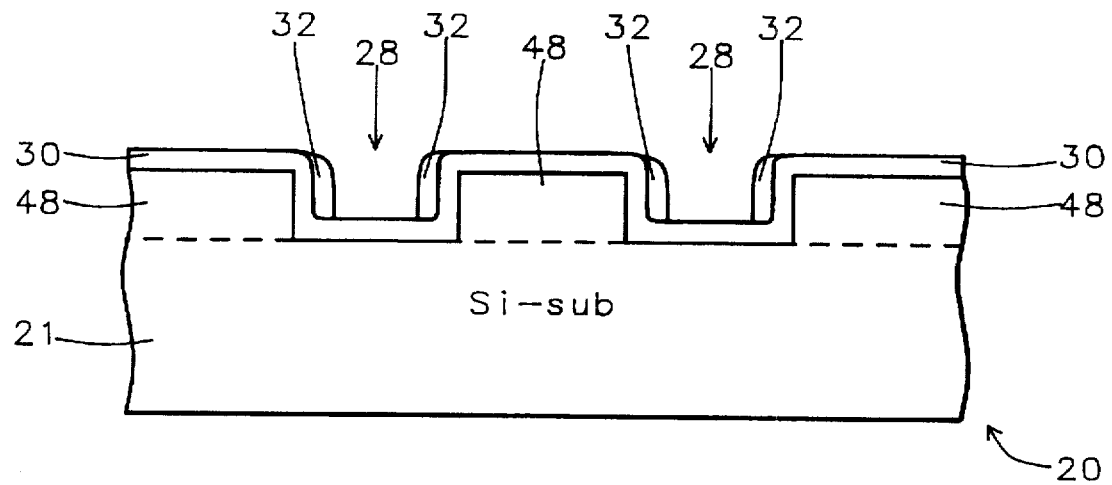

FIG. 1G shows the device of FIG. 1F after etching of spacer layer 32 of polysilicon or silicon nitride ($Si_3N_4$), preferably, with plasma etching, leaving spacers 32 adjacent to the walls of the trenches 28.

Figure 1H:
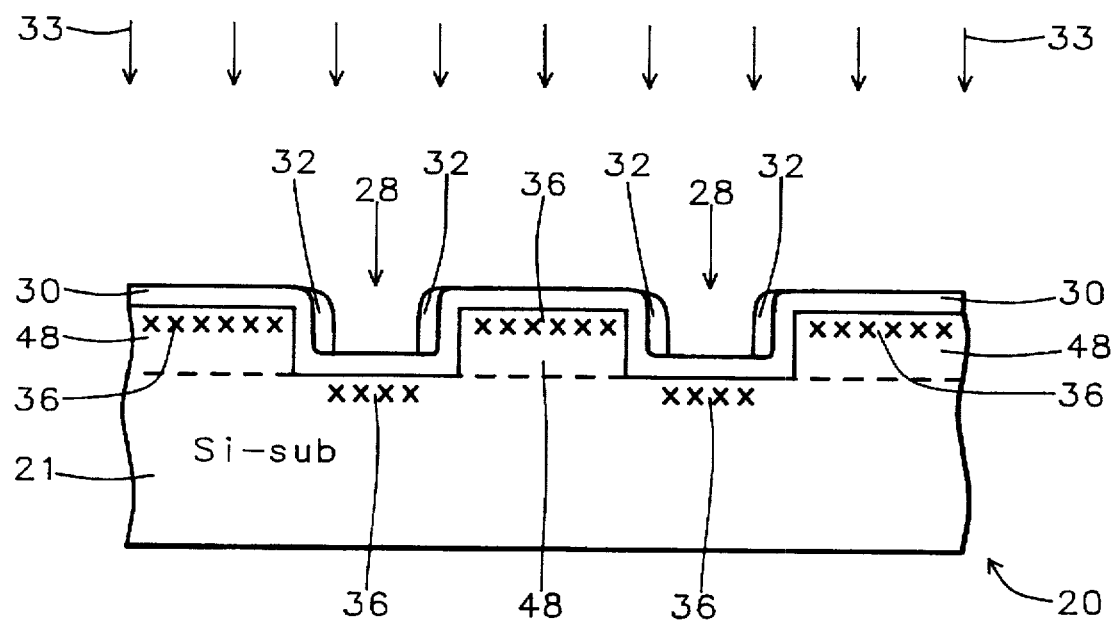

FIG. 1H shows the device of FIG. 1G after a self-aligned source/drain ion implantation with N type dopant ions 33 forming ion implanted regions 36. The silicon regions 21 and 48 near the surface of the device are doped with a N type dopant by ion implantation with ions 33 composed of a dopant of arsenic, phosphorus, or antimony applied with a dose of about 1E15 $cm^{-2}$ to about 6E15 $cm^{-2}$. Such dopants are implanted at an energy of from about 30 KeV to about 80 KeV in a high current implanter type of tool. The preferred chemical species of the dopant implanted is arsenic, with a dose of from about 2E15 $cm^{-2}$ to about 4E15 $cm^{-2}$, at an energy of from about 40 KeV to about 60 KeV.

Figure 1I:
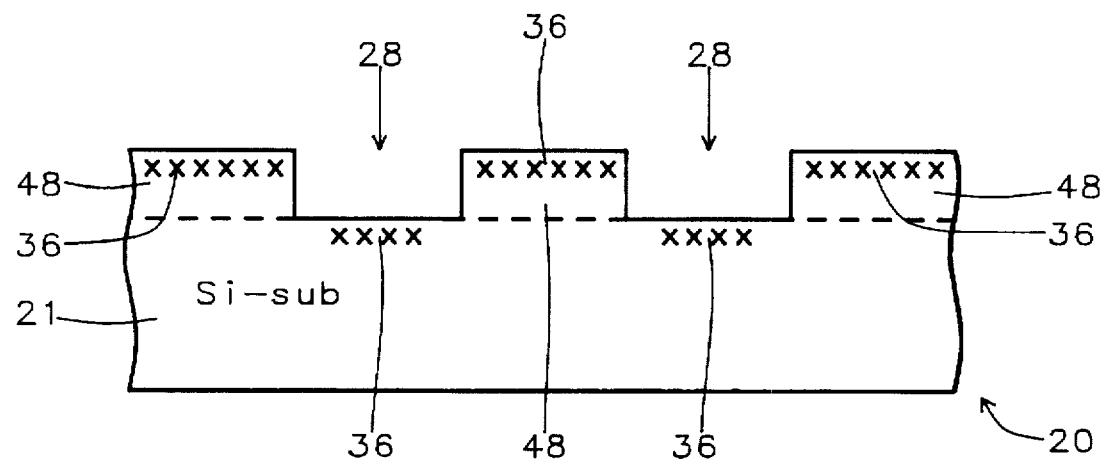

FIG. 1I shows the device of FIG. 1H after removal of the spacers 32 by etching of spacers 32 of polysilicon or silicon nitride ($Si_3N_4$). Preferably, the polysilicon is etched by plasma etching (gas of $CF_4$ or $SF_6$) or wet chemical etching (KOH.) In the case of silicon nitride ($Si_3N_4$) etching is performed by a plasma gas of $CF_4$ or $SF_6$ or wet chemical etching with $HPO_3$.

After etching away the spacers 32 the underlying silicon dioxide "oxide" layer 30 is etched away using a wet chemical etchant such as an aqueous solution of HF or BOE.

Figure 1J:
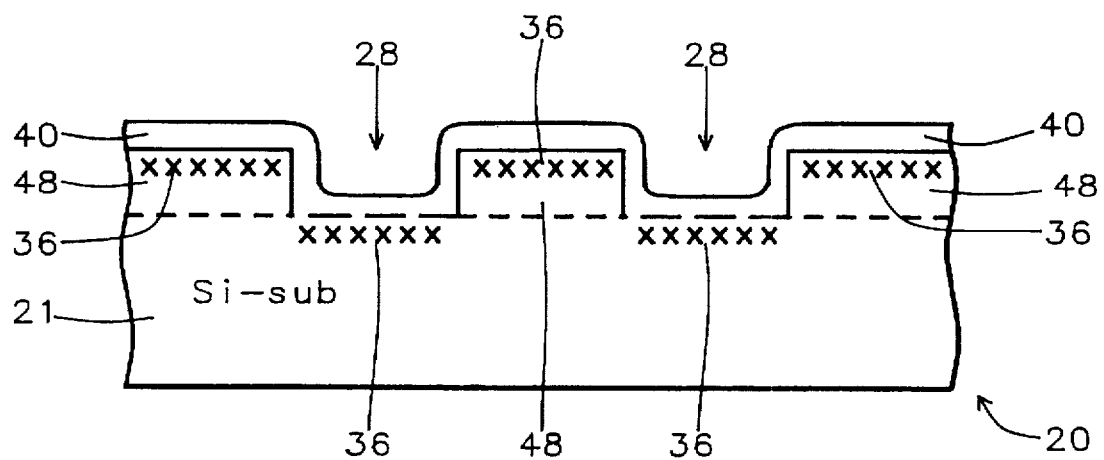

FIG. 1J shows the device of FIG. 1I after formation of a silicon dioxide gate "oxide" layer 40 having a thickness of from about 60 Å to about 200 Å, formed by the process of thermal oxidation or HTO (high temperature oxide by $SiH_2Cl_2+N_2O$) deposition.

Figure 1K:
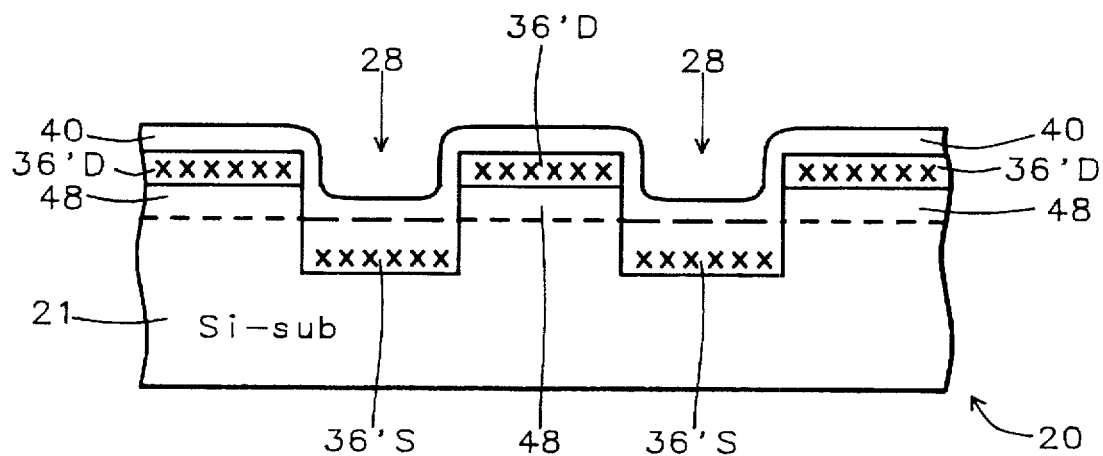

FIG. 1K shows the device of FIG. 1J after source/drain annealing at a temperature from about 850° C. to about 1,000° C. for a time from about 20 minutes to about 90 minutes. The result of the annealing is that ions 36 are driven deeper into regions 21 and 48 to form the source regions 36'S in the substrate 21 and drain 37'D regions in the regions 48.

Figure 1L:
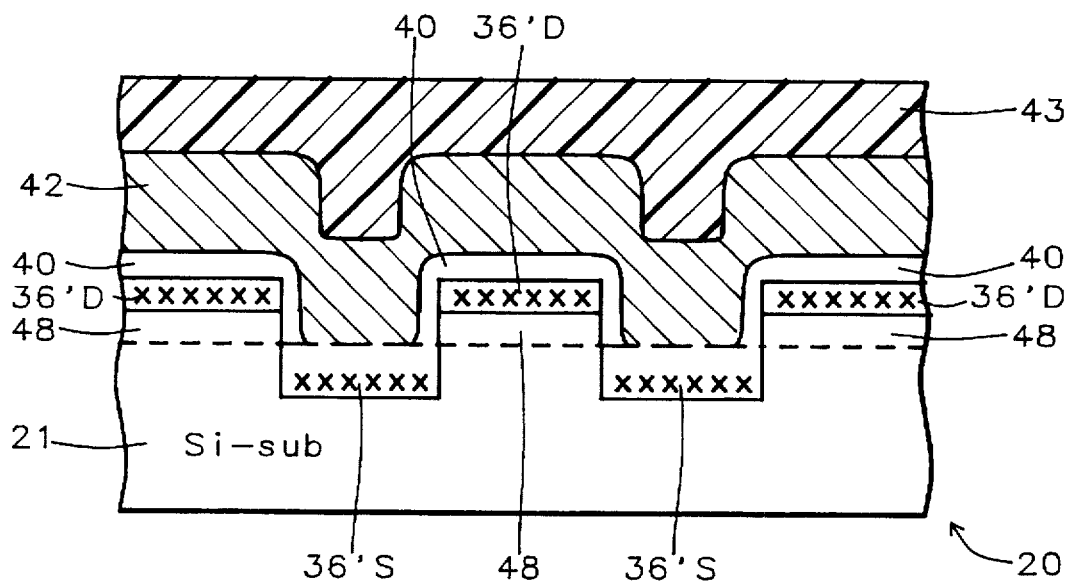

FIG. 1L shows the device of FIG. 1K after formation of a polycrystalline gate/word line layer 42 composed of polysilicon or polycide over silicon dioxide gate "oxide"layer 40. Polycrystalline gate/word line layer 42 is patterned by etching away portions thereof unprotected by gate photomask 43 to form gate and word lines from gate/word line layer 42. Word line 42 extends across a plurality of source regions 36'S in the trenches 28 and drain regions 36'D on the surface with the word line 42 passing thereover in a series arrangement.

Figure 2A:
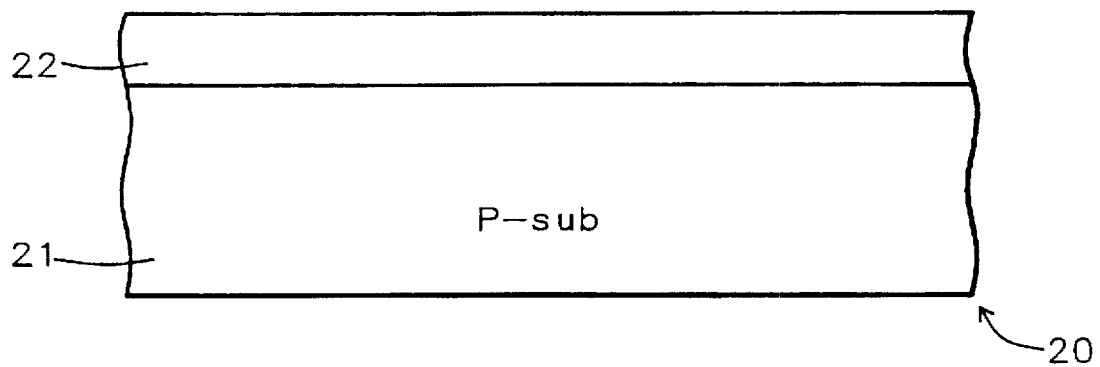
FIGS. 2A–2M show the process flow for formation of a ROM cell with silicide on the source and drain, as contrasted with the embodiment of FIGS. 1A–1L which show a ROM cell without silicide on the source or the drain.

An embodiment of this invention shown in FIGS. 2A–2N provides a ROM cell with silicide on the source and drain, as contrasted with the embodiment of FIGS 1A–1L which show a ROM cell without silicide on the source or the drain.

FIG. 2A shows a device 20 in the early stages of manufacture comprising a silicon P- substrate (P-sub) 21 covered on the surface with a blanket, masking, silicon dioxide "oxide" layer 22 having a thickness of from about 500 Å to about 3,000 Å, formed by one of two processes:

1) Thermal oxidation, dry or wet, or

2) CVD oxide deposition of LTO (Low Temperature Oxide), basically $SiH_4+O_2$ or HTO (High Temperature Oxide), basically $SiH_4$ (or $SiH_2Cl_2$)+$N_2O$.

In this invention, we illustrate a process of N-ch Mask ROM Cell which should be started with a P-type silicon substrate. Alternatively one can have a P-ch Mask ROM Cell which should be started with a N-type silicon substrate, as will be obvious to those skilled in the art.

Figure 2B:
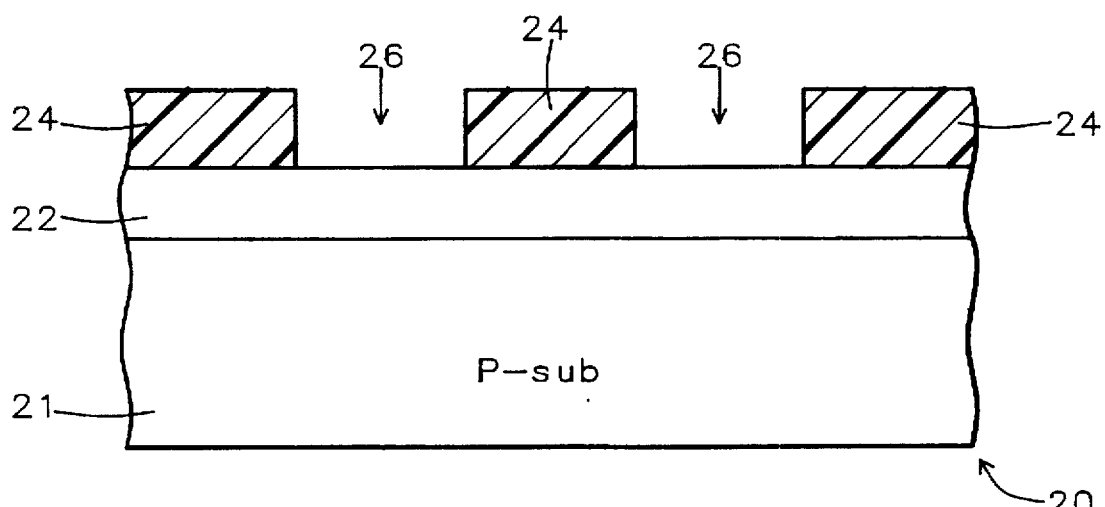

FIG. 2B shows the device of FIG. 2A with a mask 24 with openings 26 therein formed on masking "oxide" layer 26. The mask 24 which is composed of photoresist has been patterned photolithographically with a source/drain pattern by exposure and development in a conventional way. Then the patterned mask 24 is employed to etch away the unwanted portions of masking layer 22 leaving behind source/drain mask elements of masking layer 22 below mask 24. The etching of silicon dioxide masking "oxide" layer 22 is performed through openings 26 in mask 24 to form openings 27 in masking oxide layer 22. openings 27 in masking oxide layer 22 are below openings 26 in mask 24. The etching of masking "oxide" layer 22 is performed using plasma etching using an etching gas such as $C_2F_6$, $CHF_3$, or $CF_4$ as well known etchants for oxide removal.

After etching, the mask elements 24 are stripped from the device 20 by means of a conventional process for removal of photoresist. The preferred stripping process is preferably $O_2$, plasma stripping followed by $H_2SO_4/H_2O_2$.

Figure 2C:
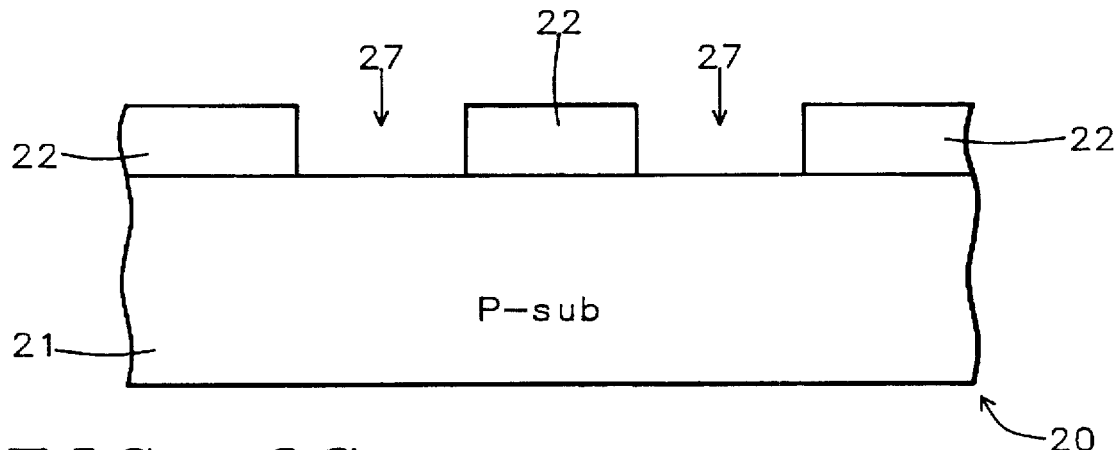

FIG. 2C shows the device of FIG. 2B with the new openings 27 in layer 22 and after stripping of the mask 24.

Figure 2D:
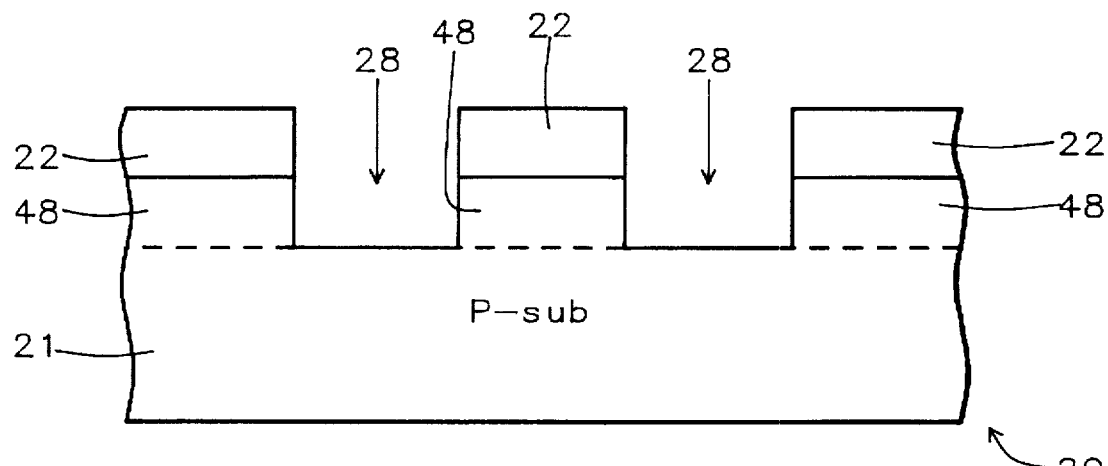

FIG. 2D shows the device of FIG. 2C after "trench" etching of silicon substrate 21 through openings 27 in layer 22 silicon dioxide masking "oxide" layer 22 to form trenches 28 in P-silicon substrate 21 to a depth of from about 3,000 Å to about 15,000 Å. The trenches 28 have vertical sidewalls and a horizontal base parallel to the surface of the substrate 21. The substrate 21 has upper surfaces (the original surfaces of the substrate) between and/or aside from said trenches 28. The etching of P- silicon substrate 21 is performed using plasma etching using gas such as $Cl_2$, HBr or other known etchants.

After the plasma silicon etching to form trenches 28, a process of wet chemical cleaning is performed using an aqueous solution of acids and alcohol such as $HF/HNO_3/CH_3COOH$ to remove possible contamination or damage introduced by the plasma etching process. Adjacent to the trenches 28 are regions 48 of the substrate 21 which will provide the vertical channels of ROM cells.

Figure 2E:
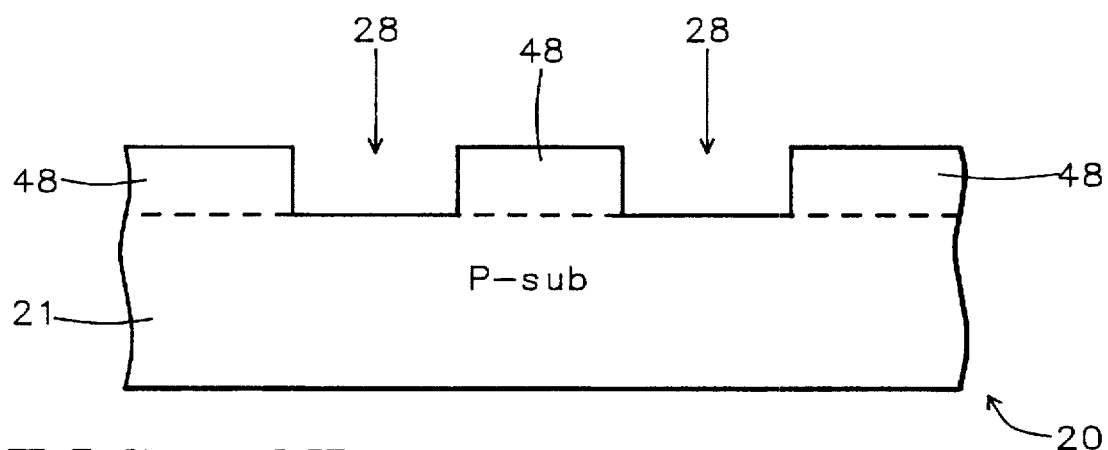

FIG. 2E shows the device of FIG. 2D after removal of the remainder of the masking, silicon dioxide "oxide" layer 22, leaving the trenches 28 between the regions 48. This second etching of masking "oxide" layer 22 is performed using using wet chemical etching such as HF or BOE (buffered oxide etchant.) In FIG. 1B and FIG. 1C on the other hand, plasma oxide etching was used because a vertical etched profile is needed there and is not necessary in connection with FIG. 2E.

Figure 2F:
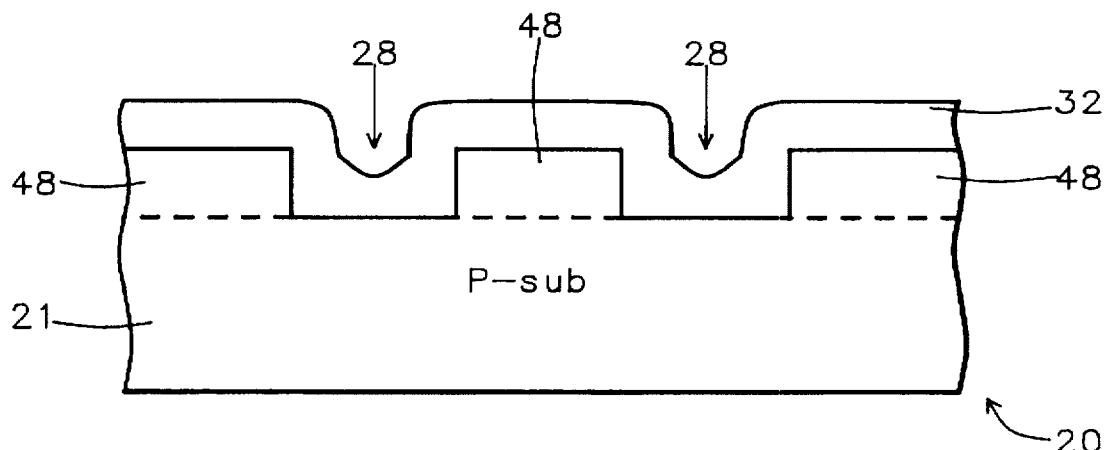

Next, as shown in FIG. 2F a spacer layer 32 composed of preferably of silicon nitride ($Si_3N_4$) is deposited having a thickness of from about 1,500Å to about 4,000 Å. (Note that in the case of this embodiment of the invention, no subspacer layer 30 is employed.) The silicon nitride ($Si_3N_4$) spacer layer 32 is formed by the process of LPCVD (low pressure CVD) with a $SiH_4$ gas with $SiH_2Cl_2$ and $NH_3$ gases. The advantage of using silicon nitride ($Si_3N_4$) is that one can remove the silicon nitride ($Si_3N_4$) spacer layer 32 later (as described in connection with FIG. 2K) with phosphoric acid which will not attack cobalt silicide.

Figure 2G:
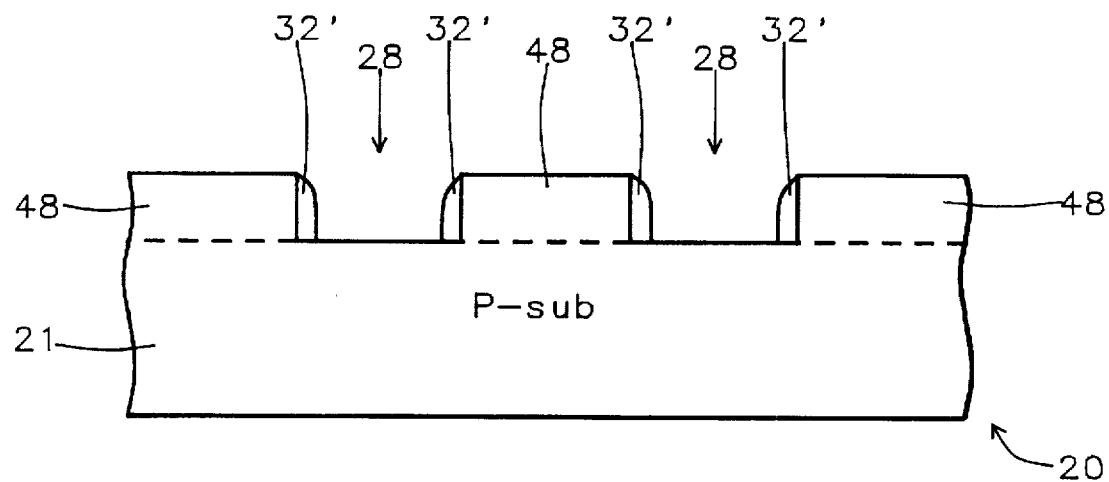

FIG. 2G shows the device of FIG. 2F after etching of spacer layer of silicon nitride ($Si_3N_4$), preferably, by plasma etching with a gas, i.e. $C_2F_6+CHF_3$ or $NF_3$, leaving spacers 32 adjacent to the walls of the trenches 28. After the spacer etching wet chemical treatment with a solution such as $HF/HNO_3/CH_3HOOH$ mixture should be applied to remove the possible damage introduced by the plasma processing.

Figure 2H:
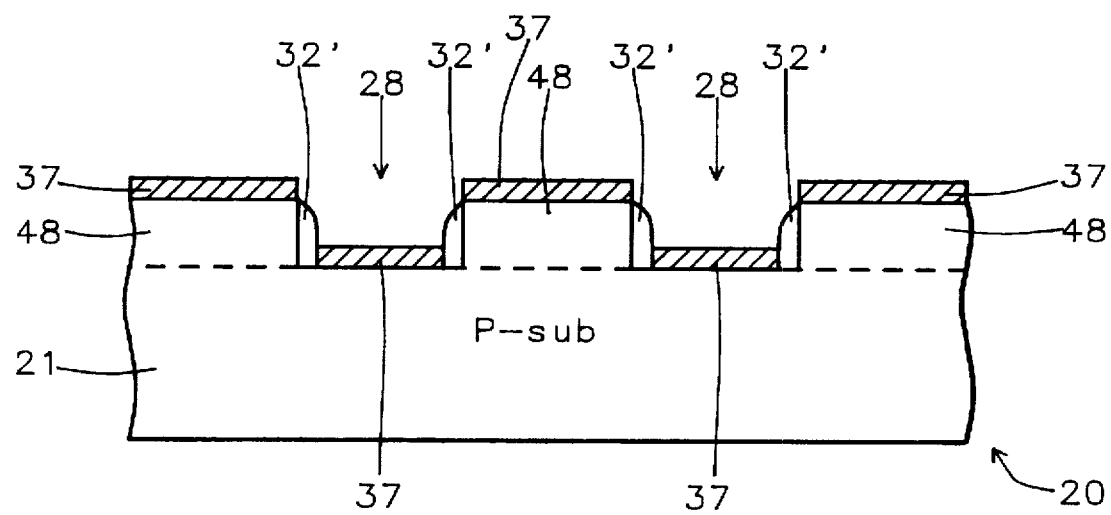

FIG. 2H shows the device of FIG. 2G after deposition of a layer 37 of a metal, preferably cobalt, adapted for forming a silicide selected from on top of silicon regions 21 and 48 having a thickness of from about 400 Å to about 1,000 Å, formed by the process of sputtering cobalt.

Silicides have the positive features of both layers with good stability, adherence, and a high conductivity. Suitable metal elements for layer 37 are selected from the group consisting of W, Ti, Co, Mo, and Ta providing corresponding silicides consisting of $WSi_2$, $TiSi_2$, $CoSi_2$, $MoSi_2$, and $TaSi_2$.

Figure 2I:
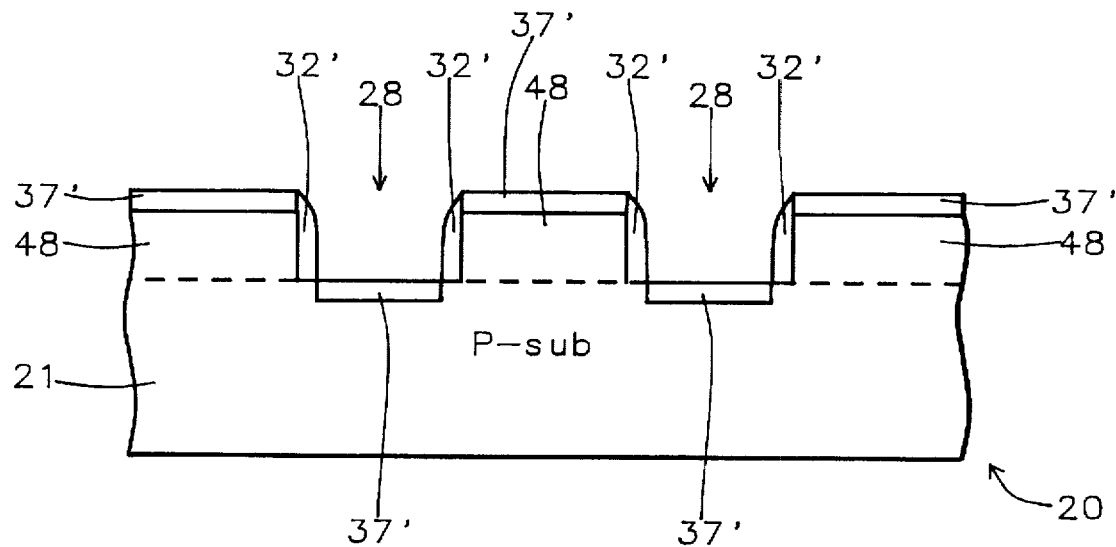

FIG. 2I shows the device of FIG. 2H after metal layer 37 has been treated by means of thermal annealing and then etching to form a silicide 37', preferably in the form of cobalt silicide $CoSi_2$. The etching of unreacted metal is usually a wet chemical etching with solution such as a mixture of $NH_4OH$, $H_2O_2$, and $H_2O$. The cobalt silicide is preferably formed by the process as follows:

1) Sputter cobalt,

2) Thermal annealing (furnace or rapid thermal anneal) to form CoSi temperature in the range of 650° C. and 750° C.

3) Etching of unreacted Co (on spacer surface) with $NH_4OH/H_2O_2/H_2O$ solution mixture.

4) Thermal annealing (furnace or rapid thermal anneal) to form $CoSi_2$ temperature in the range of 850° C. and 950° C.

Figure 2J:
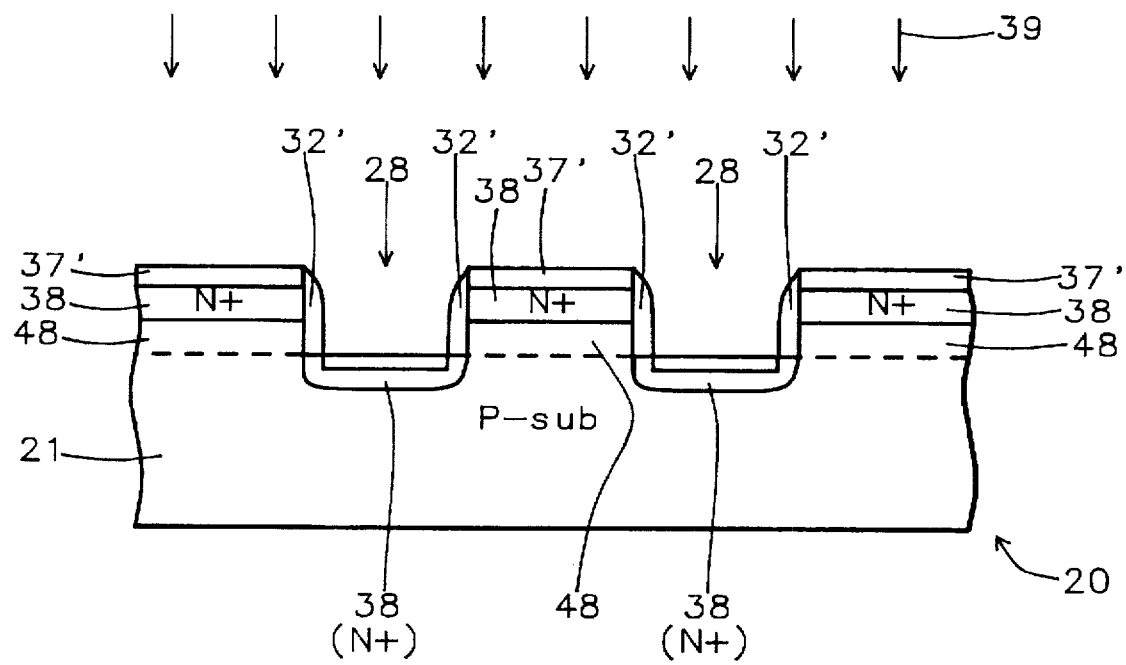

FIG. 2J shows the device of FIG. 2I after formation of source/drain doped regions 38 by self-aligned source/drain ion implantation with N+ ions 39. The silicon regions 21 and 48 near the surface of the device are doped with an N dopant by ion implantation with ions 33 composed of a dopant of arsenic, phosphorus, or antimony applied with a dose of about $8E14$ $cm^{-2}$ to about $4E15$ $cm^{-2}$. Such dopants are implanted at an energy of from about 30 KeV to about 60 KeV in a high current implanter type of tool. The preferred chemical species of the dopant implanted is arsenic (As)

with a dose of from about 1E15 cm$^{-2}$ to about 3E15 cm$^{-2}$, at an energy of from about 30 KeV to about 60 KeV.

Figure 2K:
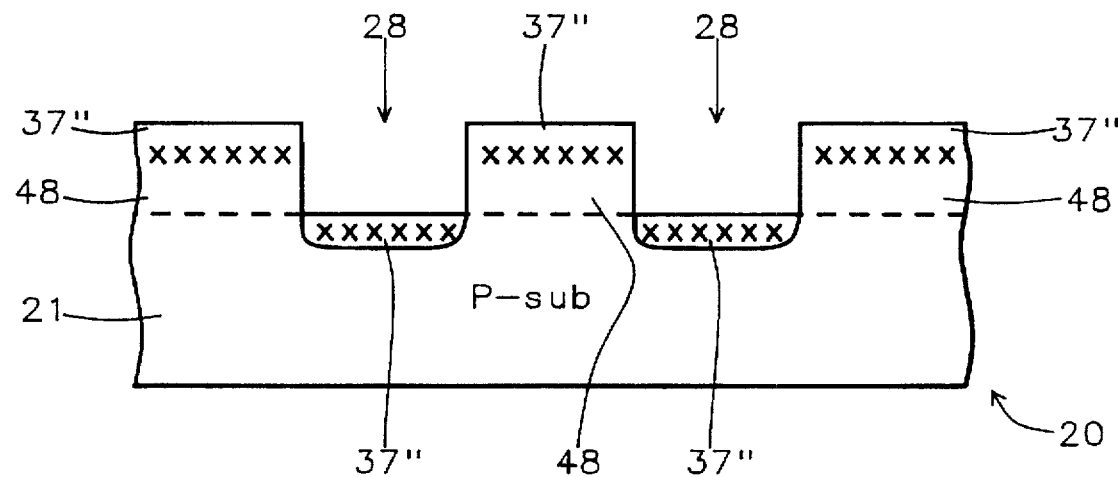

FIG. 2K shows the device of FIG. 2J after forming ion implanted regions 37" from the combination of regions 37' and N+ doped regions 38 annealing at a temperature from about 750° C. to about 900° C. for a time of at least about 20 minutes. The annealing activates the source/drain dopants (forming source S and drain D regions 37") and implantation damage. Next, the spacers 32' are removed by etching of spacers 32' preferably, with phosphoric acid HPO$_3$ which does not etch (attack) cobalt silicide.

Figure 2L:
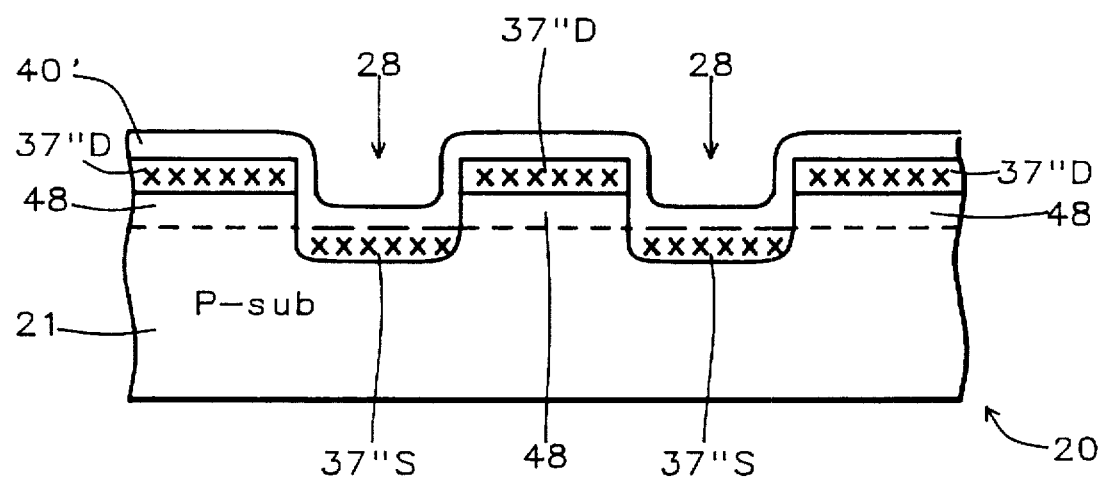

FIG. 2L shows the device of FIG. 2K after formation of a silicon dioxide gate "oxide" layer 40' having a thickness of from about 60 Å to about 200 Å, formed by the process of thermal oxidation or HTO (High Temperature Oxide) deposition with SiH$_4$/N$_2$O or SiH$_2$Cl$_2$/N$_2$O gases.

Figure 2M:
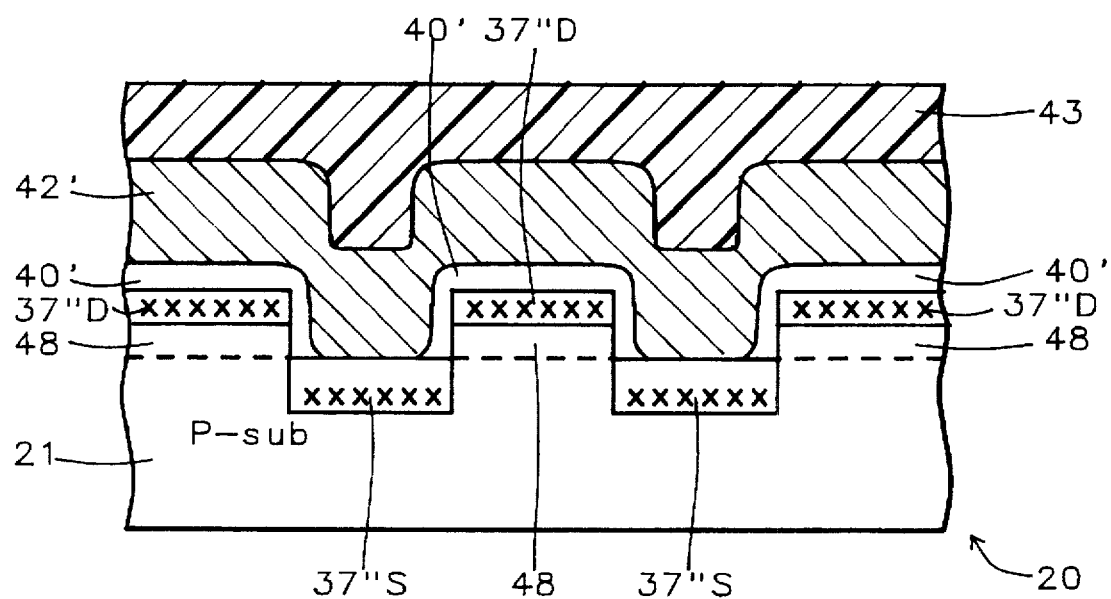

FIG. 2M shows the device of FIG. 2M after formation of a polycrystalline gate/word line layer 42' composed of polysilicon or polycide over silicon dioxide gate "oxide" layer 40'. Portions of polycrystalline gate/word line layer 42 unprotected by gate photomask 43 are etched away to form gate and word lines from gate/word line layer 42. Word line 42' extends across a plurality of source regions 37"s in the trenches 28 and drain regions 37"D on the surface with the word line 42' passing thereover in a series arrangement.

Figure 3:
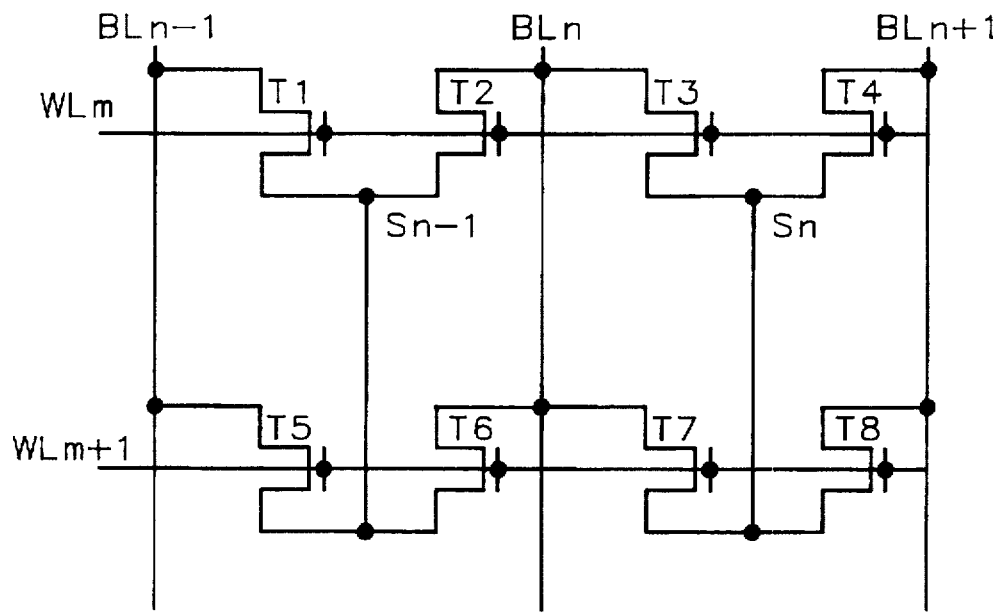
FIG. 3 shows an electrical schematic diagram of a ROM array manufacture in accordance with this invention.

FIG. 3 shows an electrical schematic diagram of a ROM array manufacture in accordance with this invention. FIG. 3 shows eight FET transistors. Four of those FET transistors T1, T2, T3, T4, have their gates connected to word line WLm. The other four FET transistors T5, T6, T7, and T8 have their gates connected to word line WLm+1. The transistors T1 and T5 have their drains connected to bit line BLn-1; transistors T2, T3, T6 and T7 have their drains connected to bit line BLn; and transistors T4 and T8 have their drains connected to bit line BLn+1. Transistors T1, T2, T5, and T6 have their sources connected together in a common node Sn-1; and transistors T3, T4, T7, and T8 have their sources connected together in a common node Sn.

Figure 4:
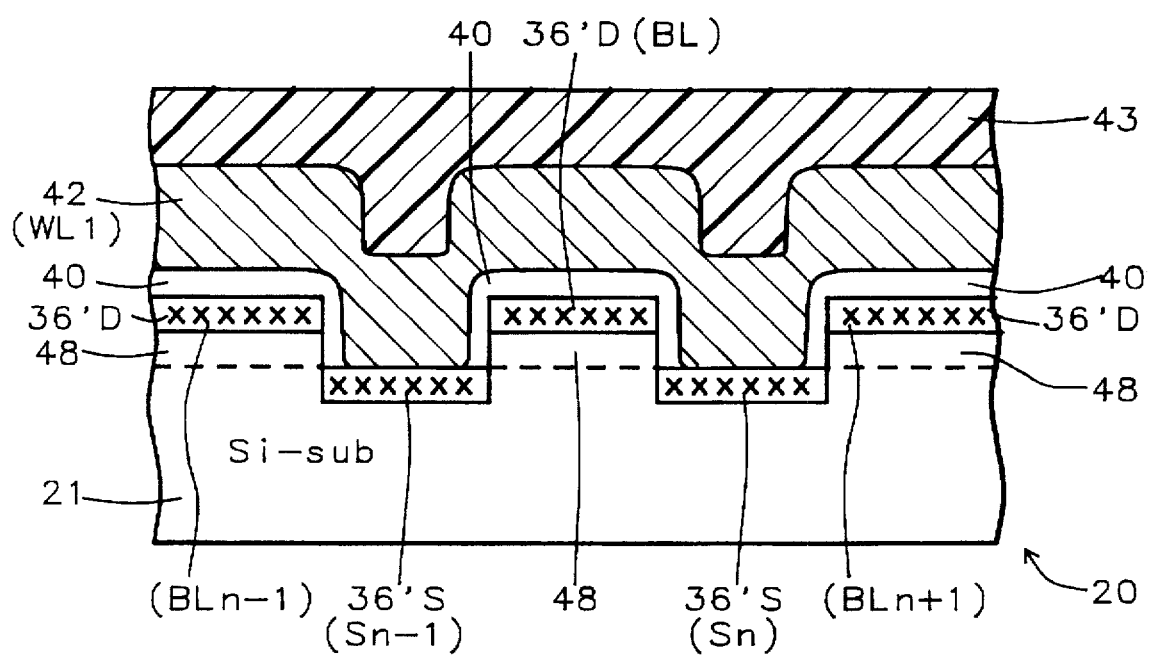
FIG. 4 shows a sectional view similar to FIG. 1L of a portion of the circuit of FIG. 3 with the bit lines and source lines indicated as BLn-1, BL, and BLn+1 and the source connections Sn-1 and Sn.

FIG. 4 shows a sectional view similar to FIG. 1L of a portion of the circuit of FIG. 3 with the bit lines and source lines indicated as BLn-1, BL, and BLn+1 and the source connections Sn-1 and Sn.

Figure 5:
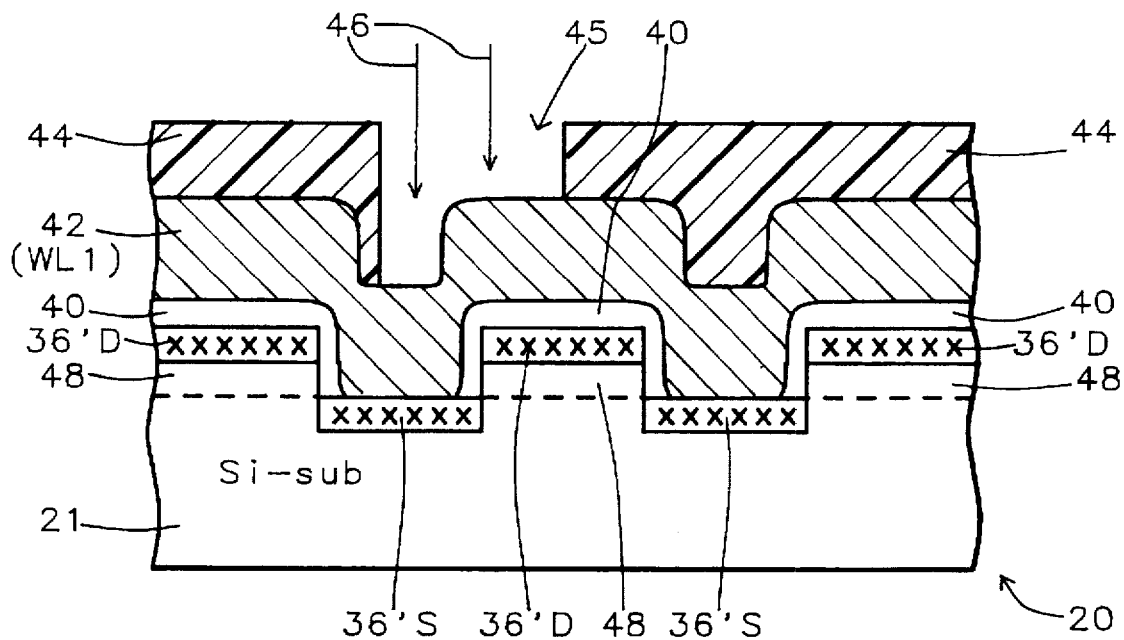
FIG. 5 shows a sectional view similar to FIG. 4 with a ROM code mask over the device of FIG. 4 for the purpose of making a ROM code implant ions into opening in a mask.

FIG. 5 shows a sectional view similar to FIG. 4 with a ROM code mask 44 over the device of FIG. 4 for the purpose of making a ROM code implant P type ions 46 into opening 45 in mask 44. The ions 46 are implanted in the channel region 48 below opening 45 between the source 36'S on the left and the drain 36'D in the center of the device. This step is performed after the polysilicon or polycide patterning. This is done before the deposition of the BPSG dielectric layer. The ions 46 are implanted into channel region 48 below the middle drain 36'D which is where the channel is located near the surface of the device 20. The channel region 48 is doped with a P type dopant by ion implantation with ions 46 composed of a dopant of boron applied with a dose of about 1E13 cm$^{-2}$ to about 510E14 cm$^{-2}$. Such dopants are implanted at an energy of from about 100 KeV to about 300 KeV in a high current implanter type of tool. The preferred chemical species of the dopant implanted is boron with a dose of from about 8E13 cm$^{-2}$ to about 4E14 cm$^{-2}$, at an energy of greater than or equal to 180 KeV to about 300 KeV.

Contact Formation

A requirement for this type of device is contact formation for forming metallization down to the bottom-source N+ at a predetermined position in the device. The contact formation involves use of photomasking, and implanting a dopant of phosphorous or the equivalent and driving the dopant to a depth required to contact the N+ region at the bottom of the trench.

Figure 6:
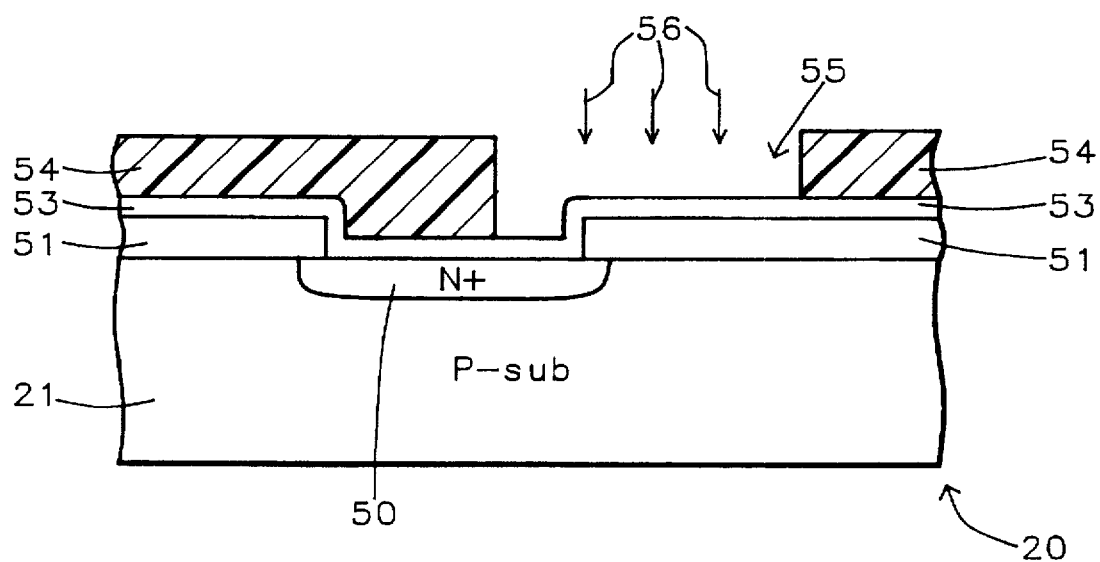
FIG. 6 shows a semiconductor device in accordance with this invention in an intermediate stage of manufacture. A silicon P- substrate (P-sub) includes an N+ region on the surface of the P- substrate.

FIG. 6 shows a semiconductor device 20 in accordance with this invention in an intermediate stage of manufacture comprising a silicon P- substrate (P-sub) 21. On the surface of the P- substrate 21 is trenched N+ source region 50 at the base of a trench in substrate 21. Layer 51 is the silicon which is not trench etched like layer 48 in FIG. 2D. Next, above layer 51 is a gate oxide layer 53, which is the remaining gate portion of gate oxide layer 40, remaining after polysilicon or polycide gate etching.

Above the gate oxide layer 53 is a photoresist mask 54 with an opening 55 overlapping source region 50, into which dopant 56 is being ion implanted. Dopant 56 comprises phosphorous, arsenic, or antimony applied with a dose of about 1E15 cm$^{-2}$ to about 6E15 cm$^{-2}$. Such dopants are implanted at an energy of from about 100 KeV to about 300 KeV in a high current implanter type of tool. The preferred chemical species of the dopant implanted is phosphorous (P) with a dose of from about 1E15 cm$^{-2}$ to about 6E15 cm$^{-2}$, at an energy of greater than or equal to 120 KeV to about 300 KeV.

Figure 7:
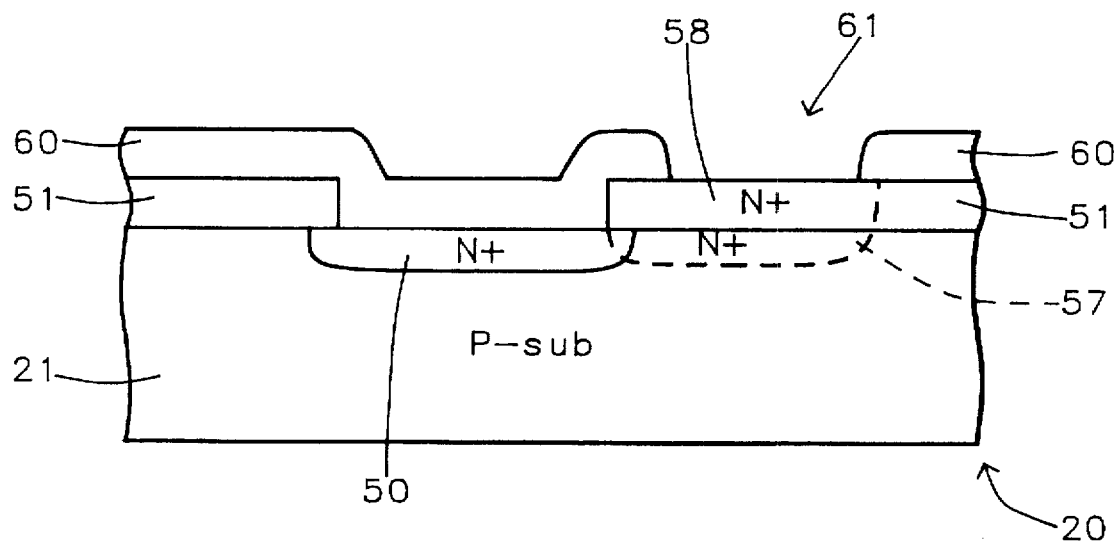
FIG. 7 shows a subsequent stage of manufacture of the device of FIG. 6 with an N+ region into which phosphorus or arsenic have been implanted.

FIG. 7 shows a subsequent stage of manufacture of the device of FIG. 6 with an N+ region 58 into which phosphorus or arsenic have been implanted. Below where the opening in mask 54 permits the implant in FIG. 6. An interlayer dielectric (ILD) layer 60 has been formed over the device after removal of the mask 54. The ILD layer is preferably composed of BPSG, having a thickness of from about 4,000 Å to about 13,000 Å patterned with a contact opening 61 to another N+ region. The region 57 in substrate 21 below N+ region 58 comprises the buried source region 57 of the ROM overlaps trenched N+ source region 50.

Figure 8:
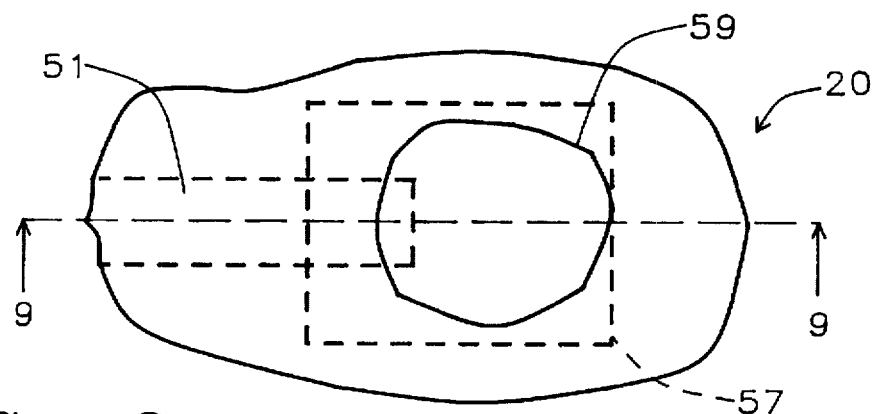
FIG. 8 shows a plan view of a fragment of the device of FIG. 7 illustrating a metal contact in an ILD layer opening.
Figure 9:
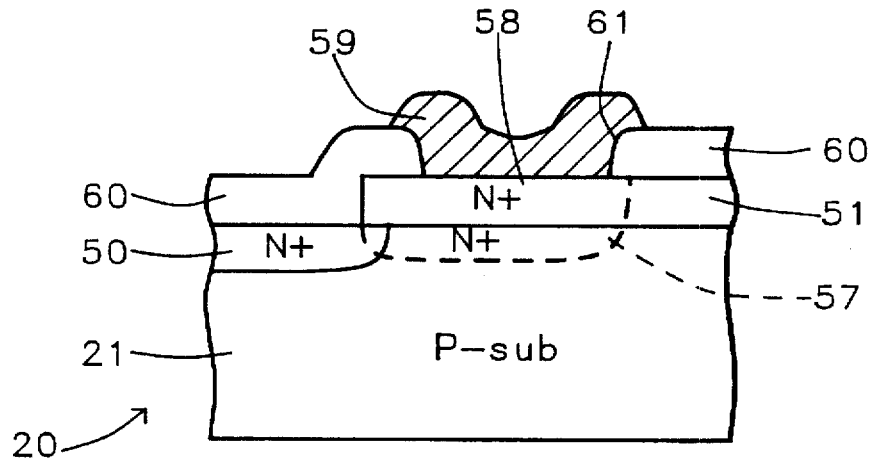
FIG. 9 is a sectional view taken along line 9—9 of FIG. 8 showing how the metal contact is in contact with N+ region over an N+ buried source region.

FIG. 8 shows a plan view of a fragment of the device of FIG. 7 illustrating the metal contact 59 in opening 61 in ILD layer 60. FIG. 9 is a sectional view taken along line 9—9 of FIG. 8 showing how the metal contact is in contact with N+ region 58 over N+ buried source region 57. Region 50 is the trenched N+ source.

Referring to FIGS. 6–9, to read a cell, e.g. bit-line, word-line, source (n, m, n-i) a cell is selected as illustrated in Table I as follows:

TABLE I

| | Bitline | Source | Wordline |
| --- | --- | --- | --- |
| Selected | 2.0 V | Ground | Vcc |
| Unselected sharing same bit-line and word-line | 2.0 V | Float | Vcc |
| Unselected others | Float or Ground | Float or Ground | Ground |

Summary

There are several advantages of this invention.

1) Source/Drain (bottom/top) are formed at the same time.
2) Silicided Source/Drain reduces source/drain resistance.
3) Flat structure, i.e. no field oxide in the ROM array for ROM. 4) One trench for two transistors, i.e. ROM cell size is reduced to half that of a conventional flat cell using the same layout rule.

While this invention has been described in terms of the above embodiments, one skilled in the art can recognize that the invention can be practiced with modifications within the spirit and scope of the appended claims, i.e. changes can be made in form and detail, without departing from the spirit and scope of the invention. Such changes come within the purview of the present invention and the invention encompasses the subject matter of the claims which follow.

Having thus described the invention, what is claimed as new and desirable to be secured by Letters Patent is as follows:

1. A plurality of semiconductor memory devices on a silicon semiconductor substrate said devices having vertical channels comprising:

a plurality of trenches in the surface of said silicon semiconductor substrate, said trenches having sidewalls in which channel regions are located, ion implanted source and drain regions in said substrate doped with an N type dopant self-aligned with said trenches with said source regions and said drain regions formed in said substrate, said source regions located below said trenches and said drain regions juxtaposed with and located between said trenches, said channel regions formed in said substrate between said trenches below said drain regions, a dielectric layer over said source/drain regions, a conductive word-line over said dielectric layer extending continuously across a said drain region down into a said trench extending across said source regions and across a next one of said drain regions and extending down into a next one of said said trenches and crossing a following one of said source regions, and a ROM code program implant region in one of said channels in the sidewall between one of said source regions and one of said drain regions adjacent thereto, said ROM code program implant region having been ion implanted with a dose of boron through said conductive word-line into one of said channel regions in said device in a selected region of said device.

2. The device of claim 1, wherein said device comprises a source/drain mask ROM memory cell with a trench etched channel said ROM code program implant region having been ion implanted with a dose of boron P type dopant from about 1E13 cm$^{-2}$ to about 5E13 cm$^{-2}$ at an energy from about 180 keV to about 300 KeV.

3. The device of claim 1, wherein said source/drain regions comprise regions implanted with dopant selected from the group consisting of arsenic, phosphorus and antimony with a dose from about 1E15 cm$^{-2}$ to about 6E15 cm$^{-2}$ which was implanted at an energy from about 30 keV to about 60 keV, and annealed into said silicon semiconductor substrate.

4. The device of claim 1, wherein source regions extend across beneath said trenches and said drain regions are juxtaposed with said trenches above the ends of said source regions.

5. The device of claim 1, comprising a flat structure.

6. The device of claim 5, wherein said flat structure includes no field oxide structures.

7. The device of claim 1, including:

a doped contact region in said substrate including a buried source region adjacent to one of said channel regions and and overlapping a said source region with a metal contact formed on the surface of said doped contact region, and means for reading a cell, including a bit-line, word-line, source (n, m, n-1) a cell is selected as shown in the following Table:

|  | Bitline | Source | Wordline |
|---|---|---|---|
| Selected | 2.0 V | Ground | Vcc |
| Unselected sharing same bit-line and word-line | 2.0 V | Float | Vcc |
| Unselected others | Float or Ground | Float or Ground | Ground |

8. A plurality of semiconductor memory devices on a silicon semiconductor substrate said devices having vertical channels comprising:

trenches in the surface of said silicon semiconductor substrate, said trenches having sidewalls in which channel regions are located, said trenches including bases in said substrate, and said substrate having upper surfaces between and/or side from said trenches.

source dopant and drain dopant which has been ion implanted into said bases and said upper surfaces of said substrate and annealed to form N-type source and drain regions in said silicon semiconductor substrate with said source regions and said drain regions formed in said substrate with said source regions located below said trenches and said drain regions juxtaposed with and between said trenches with said channel regions formed between said trenches and below said drain regions, a metal deposited on the surface of said source/drain regions having been annealed into a metal silicide in said source regions and said drain regions, a gate oxide layer formed over said device covering said source regions and said drain regions, and a conductive word-line formed over said second dielectric layer extending continuously across a said drain region and extending down into one of said trenches crossing a said source region continuing across a next one of said drain regions and extending down into a next one of said said trenches and across the next one of said source regions, and a ROM code program implant region in one of said channels in the sidewall between one of said source regions and one of said drain regions adjacent thereto, said ROM code program implant region having been ion implanted with a dose of boron through said conductive word-line into one of said channel regions in said device in a selected region of said device.

9. The device of claim 8, wherein source regions extend across beneath said trenches and said drain regions are juxtaposed with said trenches above the ends of said source regions.

10. The device of claim 9 wherein said metal comprises cobalt.

11. The device of claim 8, wherein metal deposited on the surface of said source and drain regions has been annealed into a metal silicide in said source/drain regions, and said source and drain regions are implanted with dopant selected from the group consisting of arsenic, phosphorus and antimony with from about 1E15 cm$^{-2}$ to about 6E15 cm$^{-2}$ which was implanted at an energy from about 30 keV to about 60 keV, and annealed into said silicon semiconductor substrate.

12. The device of claim 8, wherein source regions extend across beneath the base of said trenches and said drain regions extend across beneath said upper surfaces, said drain regions being juxtaposed with said trenches above the ends of said source regions.

13. The device of claim 8, wherein said device comprises a source/drain mask ROM memory cell with a trench etched channel said ROM code program implant region having been ion implanted with a dose of boron P type dopant from about 1E1 cm$^{-2}$ to about 5E13 cm$^{-2}$ at an energy from about 180 keV to about 300 keV.

14. The device of claim 8 including:

a doped contact region in said substrate including a buried source region adjacent to one of said channel regions and and overlapping a said source region with a metal contact formed on the surface of said doped contact region, and means for reading a cell, including a bit-line, word-line, source (n, m, n–1) a cell is selected as shown in the following Table:

|  | Bitline | Source | Wordline |
|---|---|---|---|
| Selected | 2.0 V | Ground | Vcc |
| Unselected sharing same bit-line and word-line | 2.0 V | Float | Vcc |
| Unselected others | Float or Ground | Float or Ground | Ground |

15. A plurality of semiconductor memory devices on a silicon semiconductor substrate said devices having vertical channels comprising:

a plurality of trenches in the surface of said silicon semiconductor substrate, said trenches having sidewalls in which channel regions are located, ion implanted source regions and drain regions in said substrate self-aligned with said trenches with said source regions formed in said substrate below said trenches and said drain regions formed on the surface of said substrate between said trenches with said channel regions formed below said drain regions between said trenches, said source regions and said drain regions doped with a dopant selected from the group consisting of arsenic, phosphorus and antimony, a dielectric layer formed over said source regions and over said drain regions, a conductive word-line over said dielectric layer extending across a said drain region and down into a said trench and across a said source region and successively across the next ones of said drain and source regions, and a ROM code program implant region in one of said channels including the sidewall between one of said source regions and one of said drain regions adjacent thereto, said program implant region having been ion implanted with through said conductive word-line into one of said channel regions in said device between a said source region and a said drain region in a selected region of said device.

16. The device of claim 15, wherein:

said source regions are formed in said trenches, said drain regions are formed on the surface of said substrate juxtaposed with and between said trenches with said channel regions therebetween, said source/drain regions doped with a dose of dopant selected from the group consisting of arsenic, phosphorus and antimony with a dose from about 1E15 cm$^{-2}$ to about 6E15 cm$^{-2}$ at an energy from about 30 keV to about 60 keV.

17. The device of claim 16, wherein:

said program implant region has been ion implanted with a dose of boron from about 1E13 cm$^{-2}$ to about 5E13 cm$^{-2}$ at an energy from about 180 keV to about 300 keV through said conductive word-line into one of said channel regions in said device between a said source region and a said drain region in a selected region of said device.

18. The device of claim 15, including:

metal deposited on the surface of said source/drain regions having been annealed into a metal silicide in said source/drain regions, said source regions are formed in said trenches, said drain regions are formed on the surface of said substrate juxtaposed with and between said trenches with said channel regions therebtween, said source/drain regions doped with a dose of dopant selected from the group consisting of arsenic, phosphorus and antimony with a dose from about 8E14 cm$^{-2}$ to about 4E15 cm$^{-2}$ at an energy from about 30 keV to about 60 keV.

19. The device of claim 18, wherein:

said program implant region was ion implanted with a dose of boron from about 1E13 cm$^{-2}$ to about 5E13 cm$^{-2}$ at an energy from about 180 keV to about 300 keV through said conductive word-line into one of said channel regions in said device between a said source region and a said drain region in a selected region of said device.

20. The device of claim 15, including:

doped contact region in said substrate including a buried source region adjacent to one of said channel regions and and overlapping a said source region with a metal contact formed on the surface of said doped contact region, and means for reading a cell, including a bit-line, word-line, source (n, m, n–1)a cell is selected as shown in the following Table:

|  | Bitline | Source | Wordline |
|---|---|---|---|
| Selected | 2.0 V | Ground | Vcc |
| Unselected sharing same bit-line and word-line | 2.0 V | Float | Vcc |
| Unselected others | Float or Ground | Float or Ground | Ground |

* * * * *